US007282841B2

(12) United States Patent
Li

(10) Patent No.: US 7,282,841 B2
(45) Date of Patent: Oct. 16, 2007

(54) LAMP ASSEMBLY WITH LED LIGHT SOURCES INCLUDING THREADED HEAT CONDUCTION BASE

(76) Inventor: Chia Mao Li, 235 Chung-Ho Box 8-24, Taipei (TW)

( * ) Notice: Subject to any disclaimer, the term of this patent is extended or adjusted under 35 U.S.C. 154(b) by 334 days.

(21) Appl. No.: 10/978,089

(22) Filed: Nov. 1, 2004

(65) Prior Publication Data

US 2006/0091772 A1 May 4, 2006

(51) Int. Cl.
*H01L 33/00* (2006.01)
*F21V 19/00* (2006.01)
*F21V 29/00* (2006.01)

(52) U.S. Cl. ........................ 313/46; 313/512; 362/294; 362/800; 362/545; 362/546

(58) Field of Classification Search ..................... None
See application file for complete search history.

(56) References Cited

U.S. PATENT DOCUMENTS 3,581,162 A * 5/1971 Wheatley ..................... 257/88
6,827,468 B2 * 12/2004 Galli .......................... 362/294
6,917,638 B2 * 7/2005 Suzuki et al. ................. 372/36
6,948,829 B2 * 9/2005 Verdes et al. ............... 362/227
7,008,095 B2 * 3/2006 Coushaine et al. ......... 362/545
2003/0063476 A1 * 4/2003 English et al. .............. 362/545
2005/0067931 A1 * 3/2005 Coushaine et al. ........... 313/46

* cited by examiner

*Primary Examiner*—Sikha Roy

(57) ABSTRACT

An LED light source applied to surveillance cameras as an infrared source or a visible-light source has a light emitting diode (LED) as the light emitting mechanism. The LED chip is mounted on a surface of a metallic body of high thermal conductivity, the surface being planar for scattering light or convex for collimating light. The heat produced in the LED chip is quickly guided to a heat-sink structure much massive than the chip and having large contact area with a heat radiating structure, thereby effectively dissipating the heat and increasing the power capacity of the chip. The heat-sink structure has a plurality of elongated heat conducting members confined by an insulating bracket at one end and mounted on a metallic base on the other end. The metallic base can be coupled with a heat radiator to enhance heat radiation.

10 Claims, 9 Drawing Sheets

Fig. 1 (PRIOR ART)

LAMP ASSEMBLY WITH LED LIGHT SOURCES INCLUDING THREADED HEAT CONDUCTION BASE

FIELD OF THE INVENTION

The present invention related to LED light sources, more particularly to an LED light source wherein the light source is a light emitting diode and has a metallic heat sink of high thermal conductivity. At the top end of the heat sink, an infrared LED chip is disposed. The surface, on which the chip attached to, can be planar for scattering light or convex for collimating light. The heat produced in the chip is absorbed quickly and conducted away by the heat sink so that the temperature of the chip can be limited. The heat is further conducted through a heat-conduction base (made of copper or aluminum), to a heat radiator and then to the ambient atmosphere.

The LED light source further comprises a lampshade made of aluminum alloy, which has a smooth and convex inner wall for reflecting and collimating the LED light. The lampshade can be secured with the heat-conduction base and form a part of a protective shell and an extra heat radiating part for the base. Therefore, the LED light source can tolerate high LED operating power and high external impact.

BACKGROUND OF THE INVENTION

Referring to FIG. 1, an infrared camera structure of the prior art comprises an outer shell 11, a lens 12, a plurality of infrared emitters 13, an upper light shade 14. The infrared emitters 13 are infrared LEDs arranged around the lens 12. The lens 12 and the infrared emitters 13 are enclosed within the outer shell 11 attached with the upper light shade 14 on the top side thereon. Since a significant amount of infrared emitters 13 are needed in such a conventional device, they occupy the majority of the camera space, therefore contributing significantly to the production cost. Further, the beam intensity of the infrared emitters 13 is so limited that the effective range for the infrared beam is short.

Infrared light source has been widely used in modern society, such as the sensing system of an automatics door and the light source of a surveillance camera. The light emitting diodes (LEDs), being the infrared light sources 13, are each of small volume but weak intensity. To use as a light source, a multitude of LEDs are needed to attain a practical light intensity, which occupy a significant amount of space and therefore increases the production cost. Further, the clustering of LEDs results in heat radiation problem, which in turn causes overheating of the light source and may result in damage of the chips in the LEDs and blurring of the transparent enclosure. Basically, a light source using a closely packed cluster of LEDs would have problems in durability and light intensity, both increasing the cost of using such light sources.

Further, the heat produced in an infrared chip 13 is conducted through metallic frame, without further heat-radiating parts. Therefore, the electric current running within the chip 13 is restricted for the protection of the chip 13. Since the current is proportional to the light intensity, the light intensity is also restricted.

SUMMARY OF THE INVENTION

The primary objective of the present invention is to provide an LED light source using light emitting diode (LED) as the light emitting mechanism and being applied to surveillance cameras as an infrared source or a visible-light source. The infrared chip is powered by DC-current wires and mounted on a metallic heat sink with high thermal conductivity and made of copper, gold, silver or aluminum. The surface of the heat sink on which the chip is mounted can be planar for scattering light or convex for collimating light. In the case of a light-scattering planar surface, the range of light illumination is short and the light coverage is wide. As the surface is convex, the light is collimated and therefore has a longer illuminating distance. Further, the heat produced in the infrared chip can be transferred quickly through the much more massive metallic heat sink, whereby the temperature of the chip is significantly reduced. The heat is then conducted to a heat-conduction base and then to the ambient atmosphere. Therefore the chip can sustain a higher current and can have a higher light intensity.

The heat sink body has a plurality of elongated heat conducting members, each of which is a copper pin in a preferred embodiment. Those copper pins are then confined by an insulating bracket and then attached to the heat-conduction base. The metallic base can be coupled with a heat radiator to enhance heat radiation.

A secondary objective of the present invention is to provide an LED light source further comprising a lampshade made of aluminum alloy, which has a smooth and convex inner wall for reflecting and collimating the LED light. The lampshade can be secured with the heat-conduction base and form a part of the protective outer shell and an extra heat radiating part for the heat-conduction base. Therefore, the present invention can tolerate high LED operating power and high external impact.

To achieve the above objectives, the LED light source comprises a base shell, wires, infrared light base, heat-conduction base, a heat sink body having a plurality of elongated heat conducting members, sink frame, lampshade and a lens. The inner wall of the base shell is provided with a screw thread for engaging a screw thread on the outer wall of the infrared light base, thereby preventing damaging the screw thread and securing the base shell. The inner rim of the lampshade is provided with a screw thread for engaging the screw thread of the heat-conduction base, whereby the lampshade can form a part of the outer shell of the light source for protecting the LEDs therein. The front end of the lampshade is provided with the lens for preventing dust infiltration.

The various objects and advantages of the present invention will be more readily understood from the following detailed description when read in conjunction with the appended drawings.

DETAILED DESCRIPTION OF THE PREFERRED EMBODIMENTS

Figure 1:
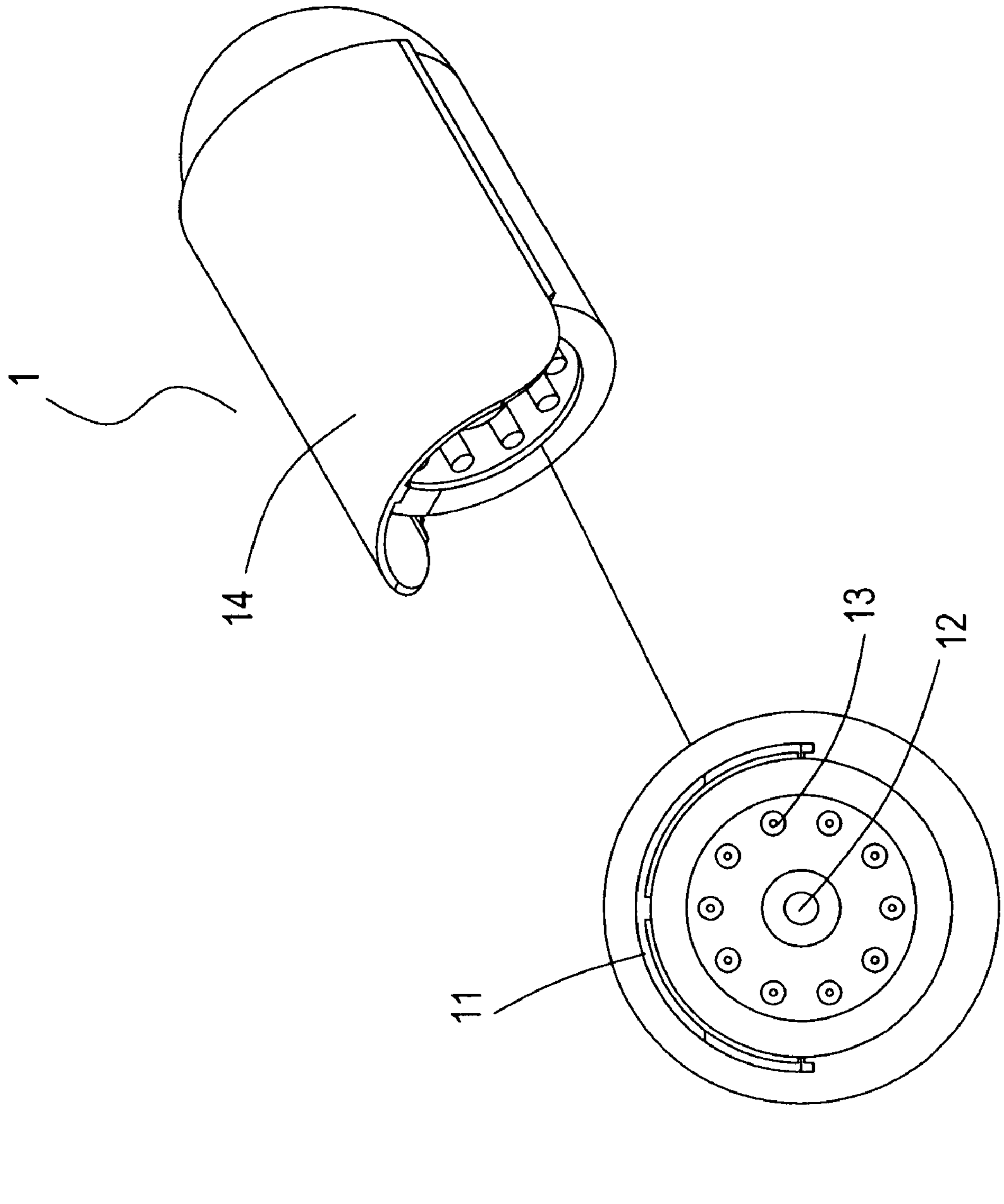
FIG. 1 shows the infrared light source of the prior art used in a camera.
Figure 2:
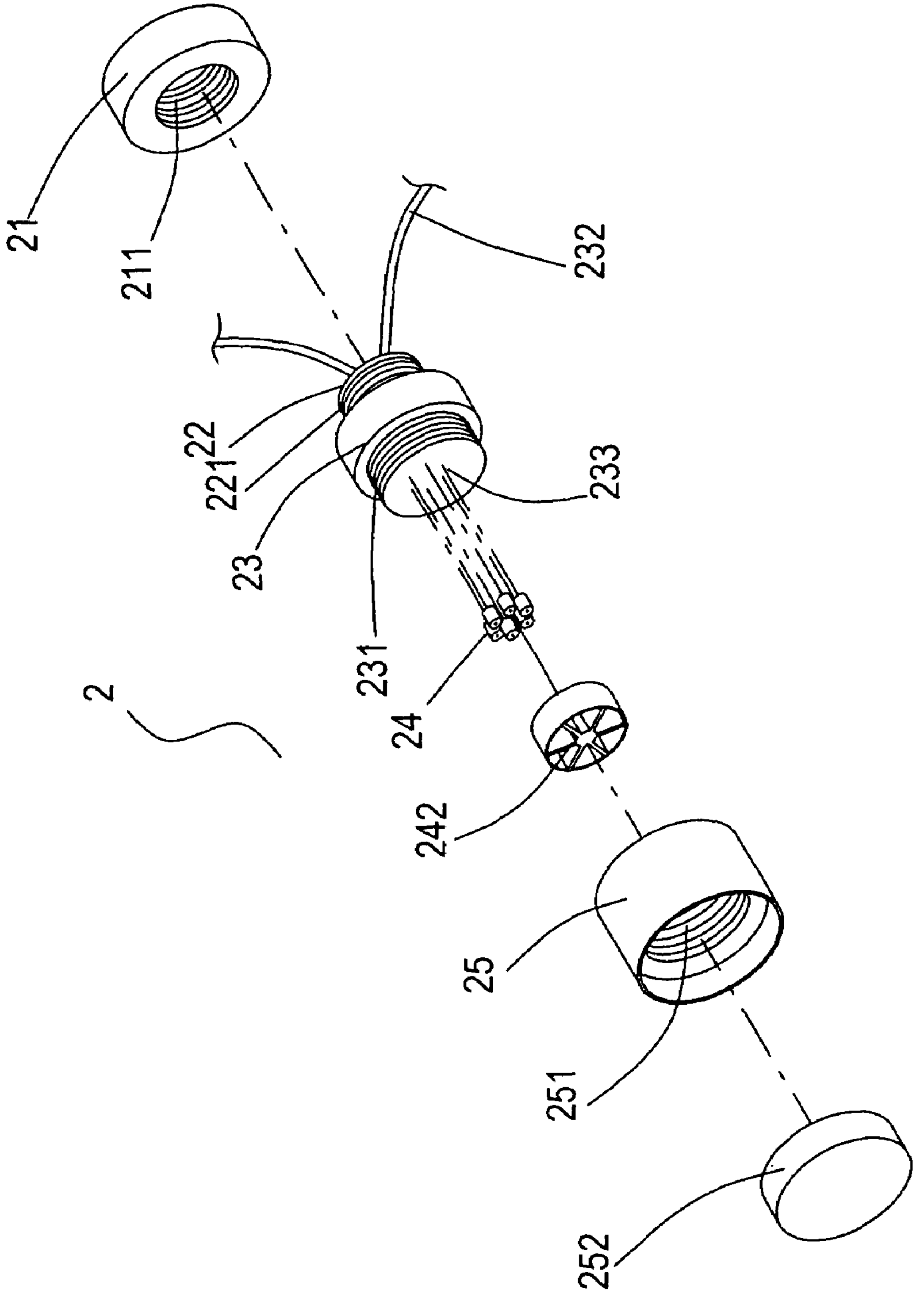
FIG. 2 is an exploded perspective view of the first preferred embodiment of the present invention.
Figure 3:
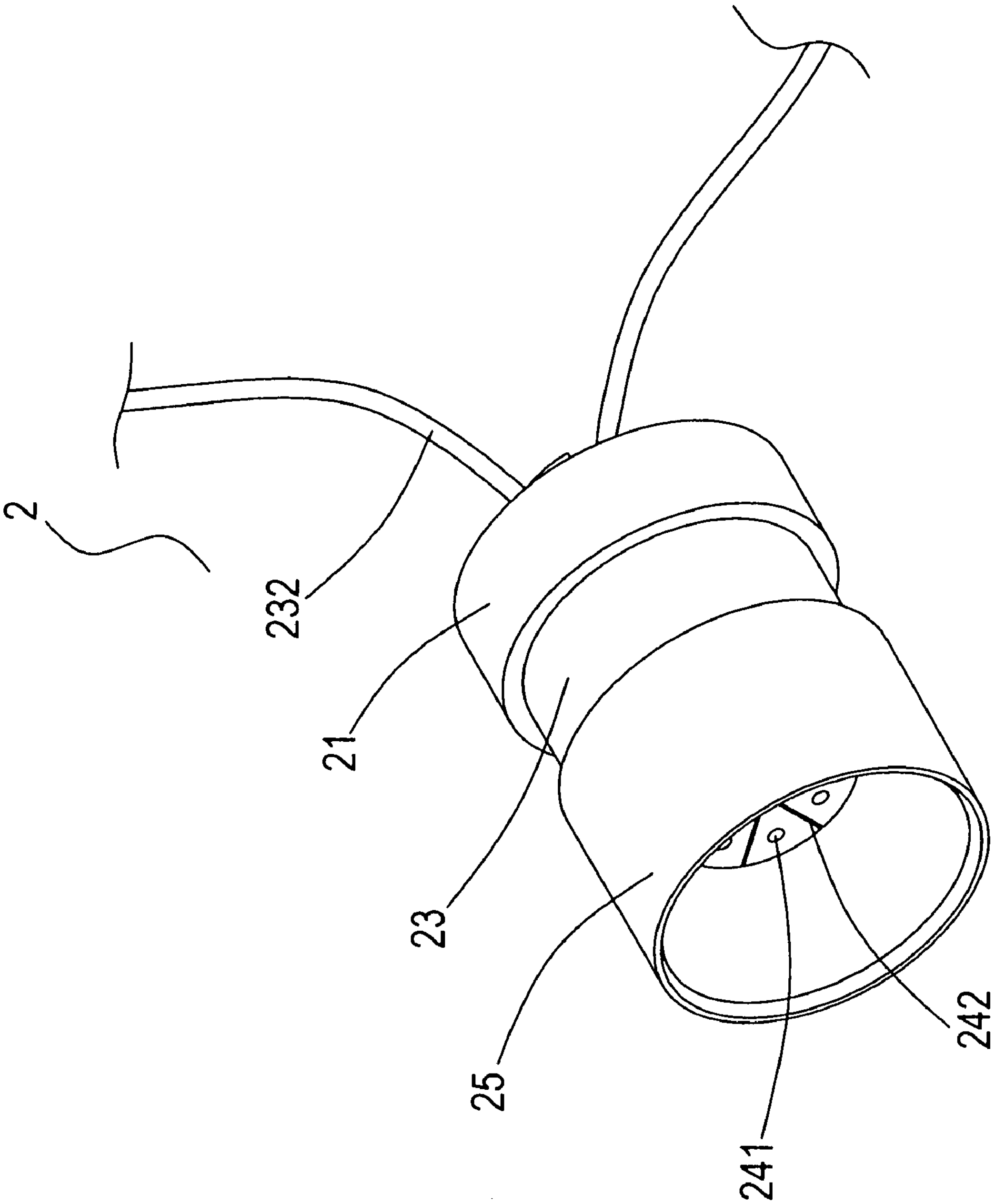
FIG. 3 is a perspective view of the preferred embodiment in FIG. 2.
Figure 4:
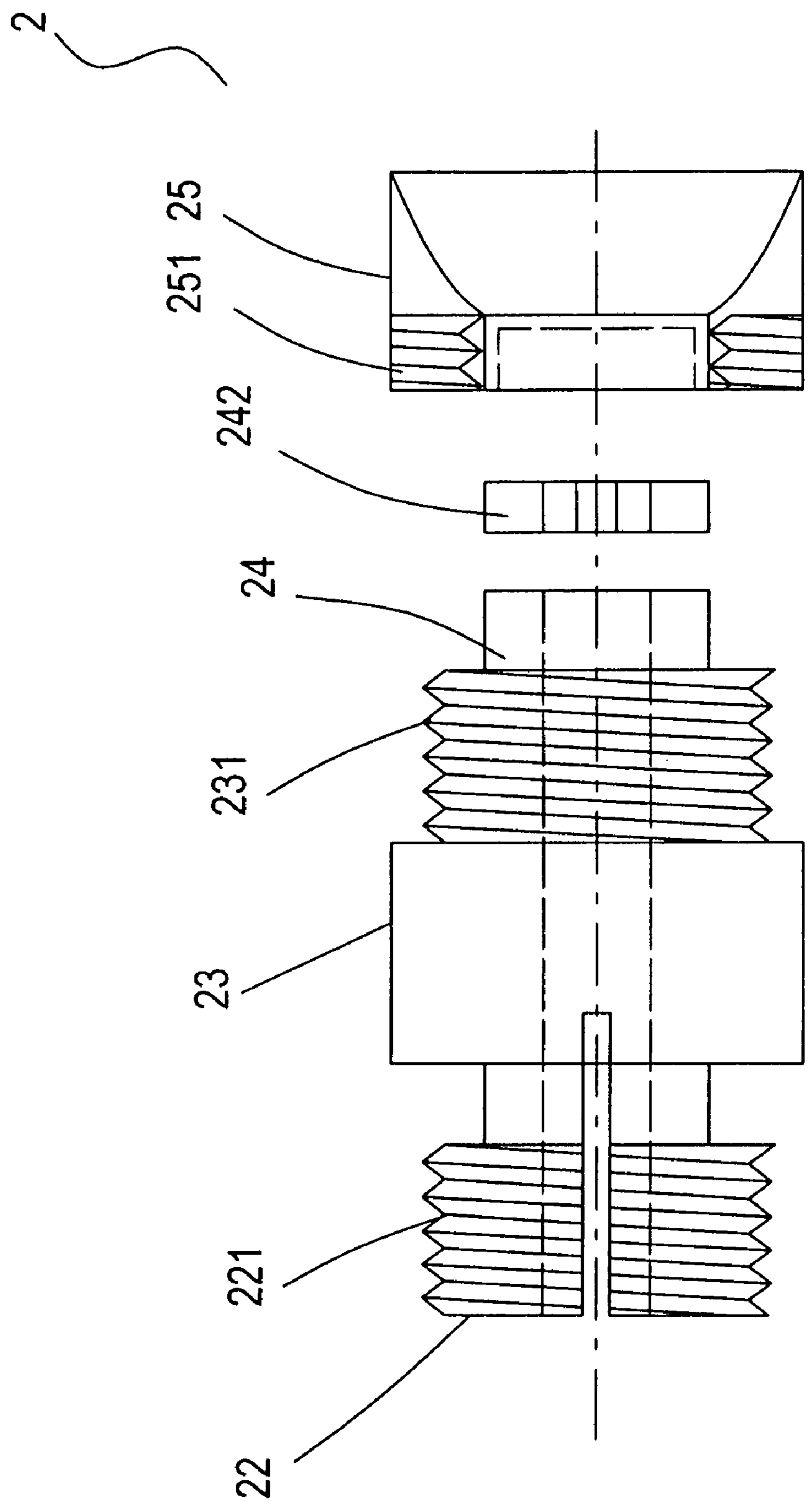
FIG. 4 is a cross-sectional view of the preferred embodiment in FIG. 3.

Referring to FIGS. 2, 3, and 4, an LED light source 2 according to the present invention comprises a base shell 21, wires 232, infrared light base 22, heat-conduction base 23, a heat sink body having a plurality of elongated heat conducting members 24, sink frame 242, lampshade 25 and a protective lens 252. The inner wall of the base shell 21 is provided with a screw thread 211 for engaging a screw thread 221 on the outer wall of the infrared light base 22, thereby securing the base shell 21 and preventing damaging the screw thread 211. A set of wires 232 is disposed within the infrared light base 22 for powering the light emitting diode (LED). For absorbing heat conducted through the heat sink body 24 and dissipating to the outside, the heat-conduction base 23 is mounted at a front end of the infrared light base 22, larger in volume than the heat sink body 24. The heat-conduction base 23, made of copper, is provided with a screw thread 231 at the front end thereof. A supporting surface 233 is formed at the front end adjacent to the screw thread 231 for securing the heat sink body 24, which has a light emitting chip 241 mounted thereon. Further, a netted insulating bracket 242 is provided to retain the elongated heat conducting members of the heat sink body 24 so that the members are held in fixed relative positions. The front ends of the heat sink body 24, which is the portion of the heat conducting members, is attached with a light emitting chip 241. The heat sink body 24 has a much larger longitudinal size than that of a light emitting chip 241 and is made of a material of high thermal conductivity. The inner wall of the lampshade 25 is made into a curved surface for reflecting and collimating the LED light. The front face of the lampshade 25 is attached with the lens 252 for protecting the LED and for preventing dust infiltration. The inner rim of the lampshade 25 is provided with a screw thread 251 for engaging the screw thread 231 of the heat-conduction base 23, whereby the lampshade 25 can form a part of the outer shell of the light source for protecting the LEDs therein and can absorbing the heat within the heat-conduction base 23 at the same time.

Figure 5:
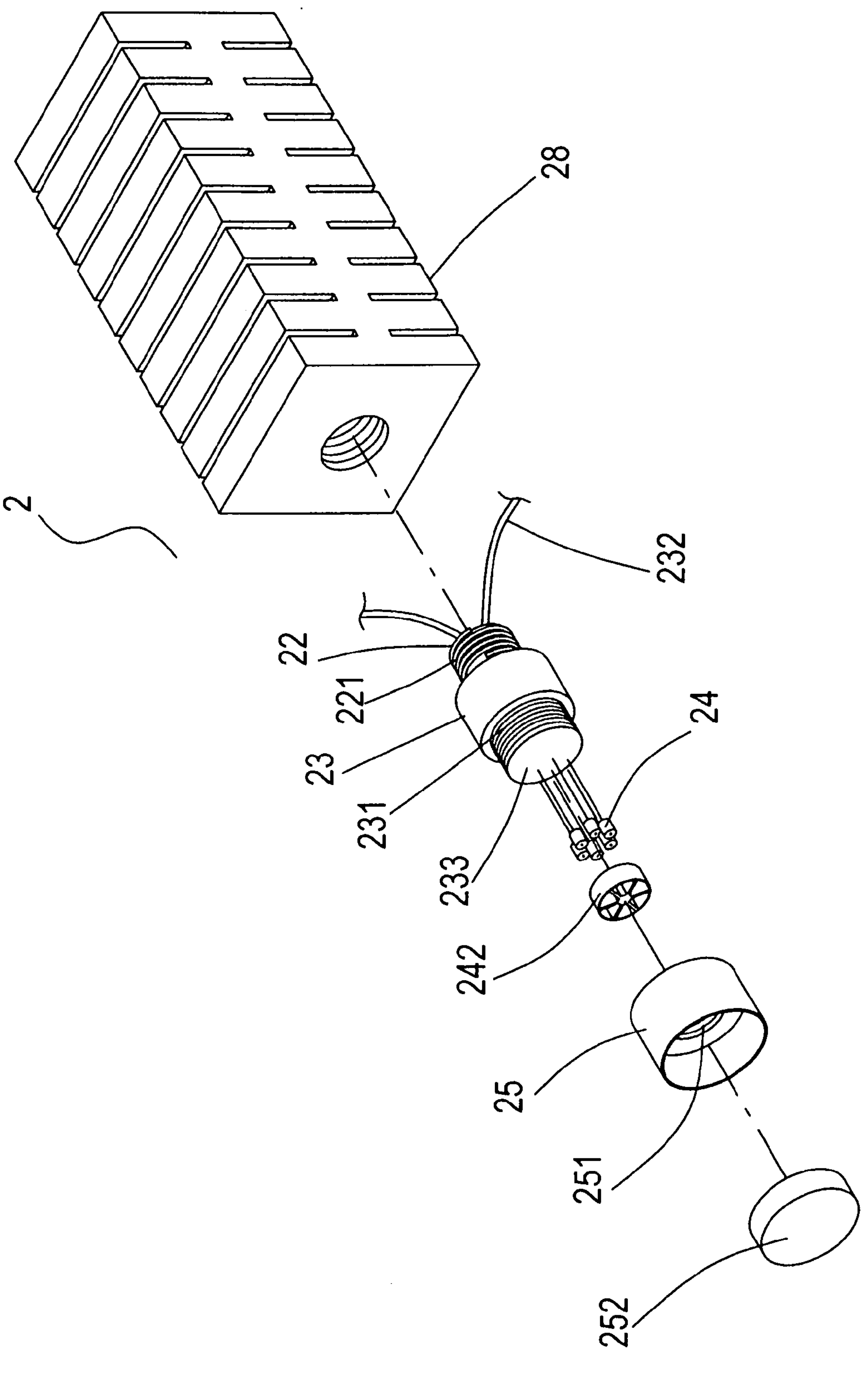
FIG. 5 is another preferred embodiment of the present invention having a cubic heat radiator.
Figure 6:
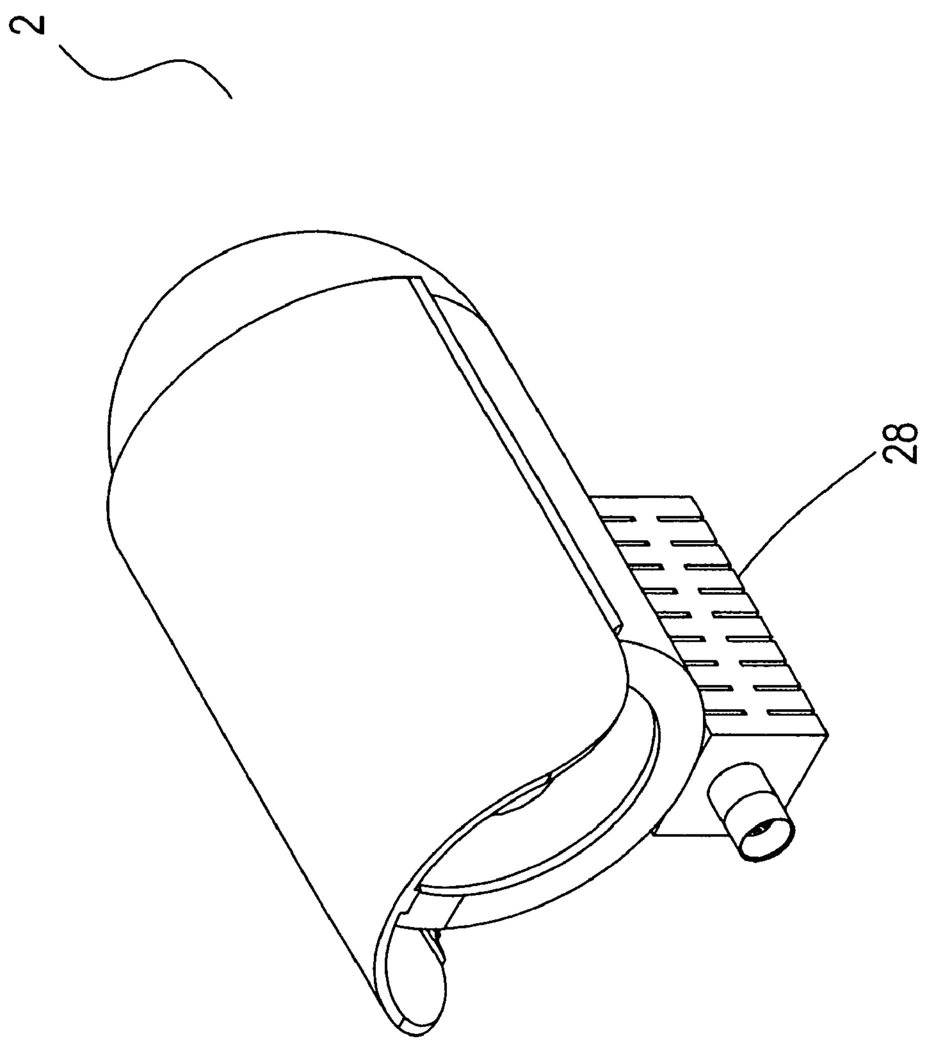
FIG. 6 is the preferred embodiment in FIG. 5 mounted under a camera.
Figure 7:
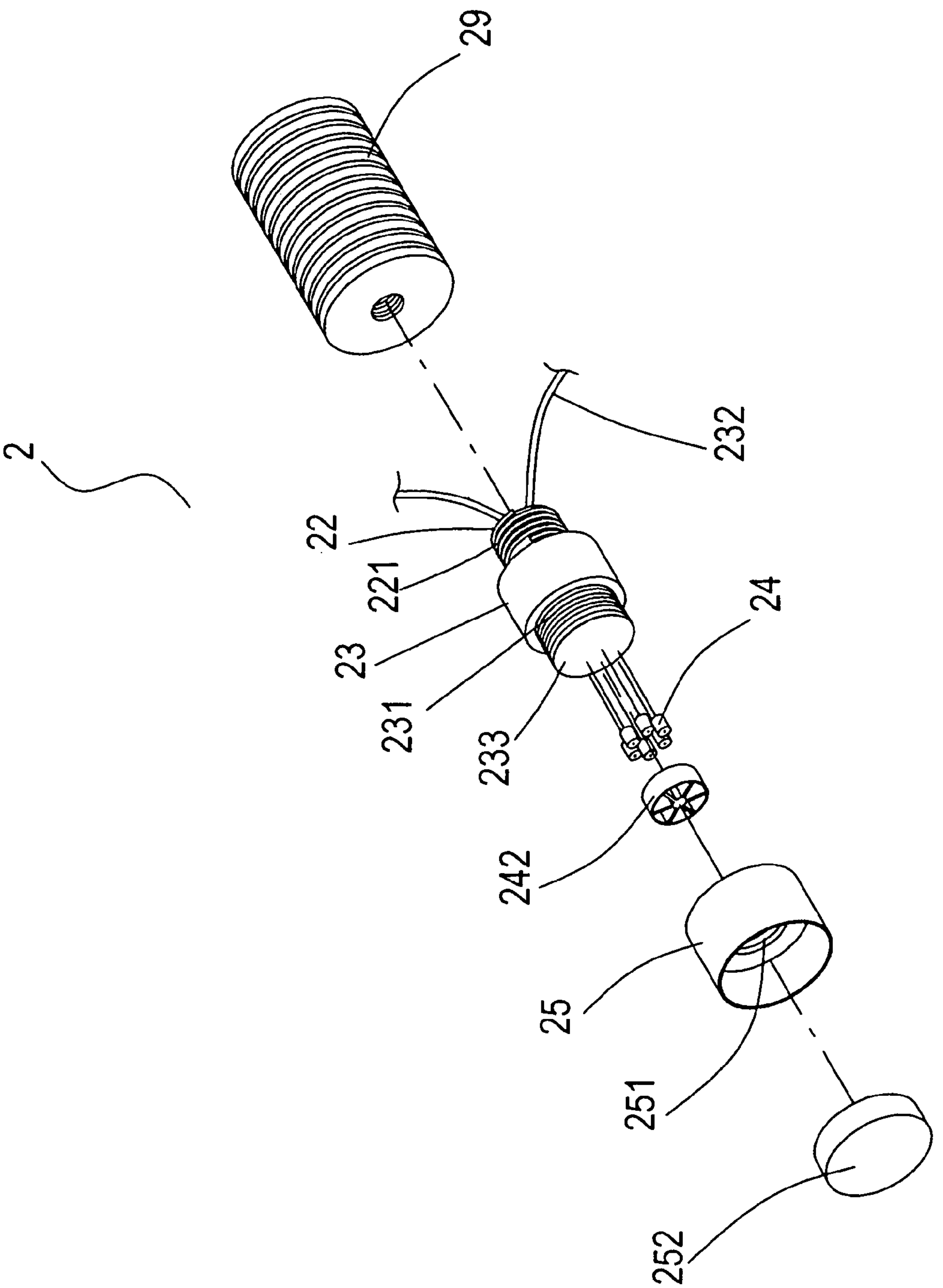
FIG. 7 is another preferred embodiment of the present invention wherein the heat radiator is cylindrical.
Figure 8:
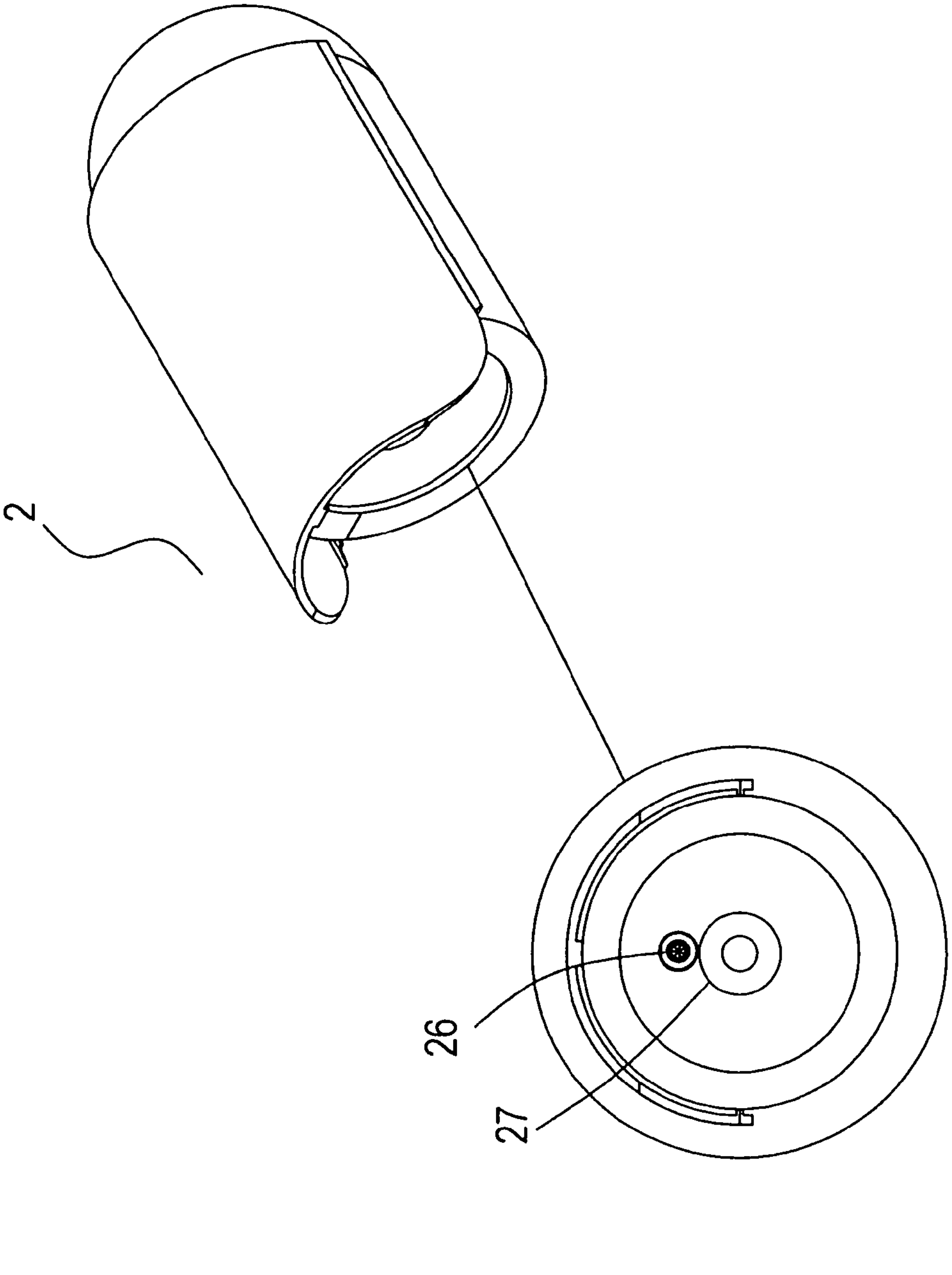
FIG. 8 is the preferred embodiment mounted on a camera.
Figure 9:
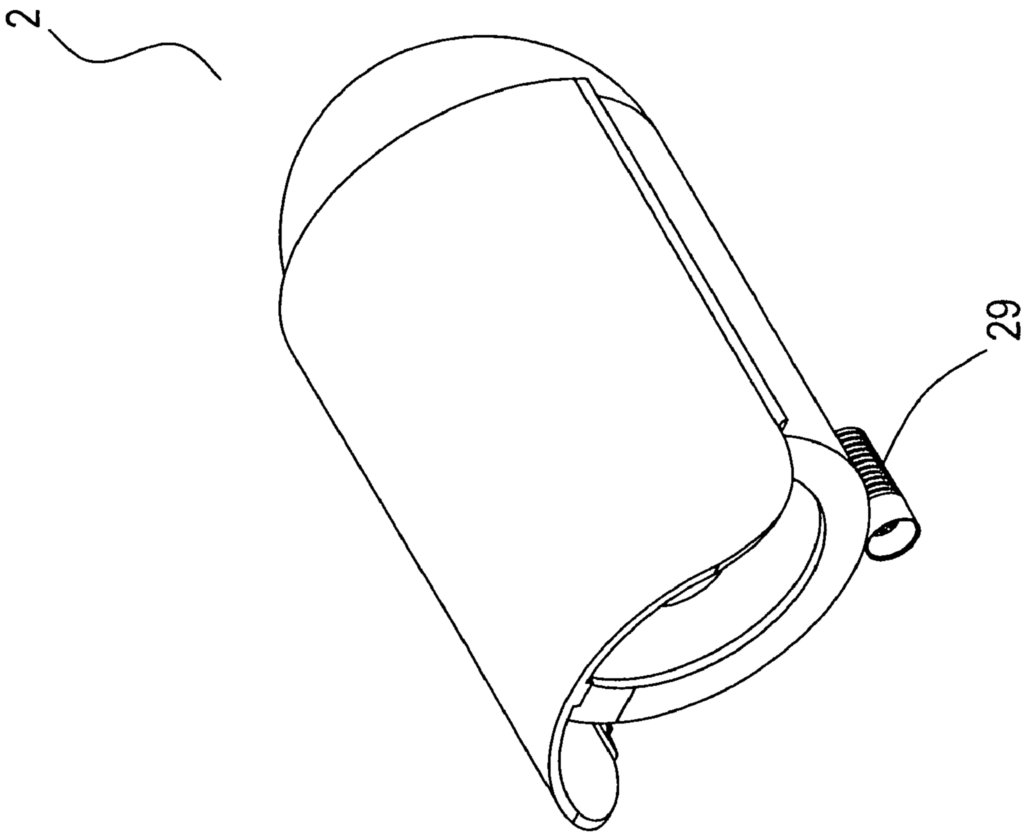
FIG. 9 is another configuration for mounting the cylindrical preferred embodiment with a camera.

FIG. 5 is another preferred embodiment of the present invention having a cubic heat radiator. FIG. 6 is the preferred embodiment in FIG. 5 mounted under a camera. FIG. 7 is another preferred embodiment of the present invention wherein the heat radiator is cylindrical. FIG. 8 is the preferred embodiment mounted on a camera. FIG. 9 is another configuration for mounting the cylindrical preferred embodiment with a camera.

Compared with the conventional products, the present invention has the following advantages: By utilizing the heat sink body to dissipate the heat produced in the light emitting chip having a much higher light intensity and the lampshade for effectively collimating its light beam, the present invention needs only one light emitting chip, significantly reducing the production cost. 2. The heat produced in the light emitting chip is quickly guided through the heat sink body, heat-conduction base, radiator and lampshade, then dissipated into the ambient atmosphere, whereby the durability of the light emitting chip can be significantly enhanced. Because of the effective heat condition mechanism, the light emitting chip can sustain a high electric current and therefore provide a high light intensity.

In the present invention, an outer side of the lampshade is a round cylinder with a unique diameter. The heat conduction base 23 has a smooth cylinder after the screw thread 231 thereof. Diameters of the screw thread 231 of the heat conduction base 23 is smaller than that of the smooth cylinder; and an outer side of the smooth cylinder has an unique diameter; and the front face of a heat-conduction base 23 connecting the second end of the heat conducting member is a flat surface. The diameter of the smooth cylinder is similar than an outer diameter of the lampshade 25.

Wires 232 supplying power to said LED light source are extended out from an end face of the heat conduction base. The electrically insulating bracket 242 is formed by two rounds, an inner round and an outer round, the inner round is inside the outer round, a plurality of radiating ribs serves to connect the inner round to an outer rounds.

Furthermore, in the present invention, the infrared light emitting chip includes light emitting diodes.

The present invention is thus described, and it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A lamp assembly with an LED light source, comprising:

a heat sink body including a bundle of elongated heat conducting members having a first end face for mounting an infrared light emitting chip and a second end face for connecting a front face of a heat-conduction base, said first and second end faces being selected from one of planar surfaces and convex surfaces, said heat conducting members being confined by an insulating bracket locating close to said first end face, whereby said heat sink body can absorb the heat produced in said infrared light emitting chip and quickly transfer the heat to said heat-conduction base;

the heat-conduction base having a first end and a second end; the first end being provided with a screw thread, said screw thread at said first end for engaging a screw thread formed on an inner wall of a lampshade, said heat-conduction base being capable of absorbing and dissipating the heat conducted from said heat sink body;

the electrically insulating bracket for retaining and confining said heat conducting members of said heat sink body, said insulating bracket having an inner face attached on a front face of said heat-conduction base; and an infrared light base installed at a second end of the heat conducting base; an outer wall of the infrared light base being formed with a screw thread for engaging with the screw thread in an inner wall of the base shell, thereby securing the base shell and preventing damaging the screw thread wherein an outer side of the lampshade is a round cylinder with a unique diameter; the heat conduction base has a smooth cylinder after the screw thread thereof, diameters of the screw thread of the heat conduction base is smaller than that of the smooth cylinder; and an outer side of the smooth cylinder has an unique diameter; front face of the heat conduction base connecting the second end of the heat conducting member being a flat surface; the diameter of the smooth cylinder is smaller than an outer diameter of the lampshade;

wherein wires that supply power to said LED light source are extended out from an end face of the heat conduction base; and wherein the electrically insulating bracket is formed by two rounds, an inner round and an outer round, the inner round is inside the outer round, a plurality of radiating ribs serves to connect the inner round to an outer rounds.

2. The lamp assembly with an LED light source of claim 1 wherein said heat sink body is made of a metallic material of high thermal conductivity selected from gold, silver, copper and aluminum.

3. The lamp assembly with an LED light source of claim 1 wherein the geometry of said heat sink body is selected from a cylinder, a cube and an irregular polygon.

4. The lamp assembly with an LED light source of claim 1 wherein said heat conducting members of said heat sink body are retained by an insulating bracket and attached to said heat-conduction base, and wherein the number of said heat conducting members is determined by the power of said infrared light emitting chip, said insulting bracket therefore changing the diameter and the structure thereof accordingly.

5. The lamp assembly with an LED light source of claim 1 wherein said heat-conduction base is made of a metallic material of high thermal conductivity selected from gold, silver, copper and aluminum, and wherein said heat-conduction base is a part of the outer shell of said LED light source or is connected to an heat radiator that is selected to be a part of the outer shell of said LED light source.

6. The lamp assembly with an LED light source of claim 1 wherein an outer screw thread at said first end of said heat-conduction base can be connected to a unit selected from said infrared light base by engaging an inner screw thread thereof and a heat radiator of predetermined geometric structure.

7. The lamp assembly with an LED light source of claim 6 wherein said heat radiator is made of a metallic material and provided with heat releasing holes on an outer surface thereon.

8. The lamp assembly with an LED light source of claim 1 wherein said lampshade is made of a metallic material of high thermal conductivity selected from gold, silver, copper and aluminum.

9. The lamp assembly with an LED light source of claim 1 wherein said lampshade is secured with said heat-conduction base and assist heat dissipation, and wherein an inner wall of said lampshade forms a bowl-shaped surface and is provided with a protective lens over the front opening thereof.

10. The lamp assembly with an LED light source of claim 1, wherein the infrared light emitting chip includes light emitting diodes.

* * * * *